(12) United States Patent
Rombach et al.

(10) Patent No.: US 8,111,092 B2
(45) Date of Patent: Feb. 7, 2012

(54) REGISTER WITH PROCESS, SUPPLY VOLTAGE AND TEMPERATURE VARIATION INDEPENDENT PROPAGATION DELAY PATH

(75) Inventors: Gerd Rombach, Freising (DE); Sotirios Tambouris, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 923 days.

(21) Appl. No.: 12/129,064

(22) Filed: May 29, 2008

(65) Prior Publication Data

US 2008/0301485 A1    Dec. 4, 2008

Related U.S. Application Data

(60) Provisional application No. 61/016,691, filed on Dec. 26, 2007.

(30) Foreign Application Priority Data

May 30, 2007   (DE) ...................... 10 2007 024 955 U

(51) Int. Cl.
*H03L 7/06* (2006.01)

(52) U.S. Cl. ........................................ 327/156; 713/600
(58) Field of Classification Search .................. 327/156, 327/296; 331/2; 713/600
See application file for complete search history.

(56) References Cited

U.S. PATENT DOCUMENTS

| 6,310,928 | B1 | 10/2001 | Yunome |
| 6,526,374 | B1 | 2/2003 | Martin |
| 6,687,321 | B1 | 2/2004 | Kada et al. |
| 2002/0017939 | A1 | 2/2002 | Okuda et al. |
| 2003/0221044 | A1 | 11/2003 | Nishio et al. |
| 2005/0237117 | A1 | 10/2005 | Vu et al. |
| 2005/0259504 | A1 | 11/2005 | Murtugh et al. |

*Primary Examiner* — Clifford Knoll
(74) *Attorney, Agent, or Firm* — John J. Patti; Wade J. Brady, III; Frederick J. Telecky, Jr.

(57) ABSTRACT

A digital data register is disclosed that provides setup and hold timing on the pre-register side, clock centering on the post-register side, and constant propagation delay time over variations in process, supply voltage and temperature (PVT) using a novel means to generate and distribute the clock signal. These features allow the register to be used in applications operating at clock frequencies in excess of 800 MHz.

10 Claims, 3 Drawing Sheets

REGISTER WITH PROCESS, SUPPLY VOLTAGE AND TEMPERATURE VARIATION INDEPENDENT PROPAGATION DELAY PATH

This patent application claims priority from German Patent Application No. 10 2007 024 955.3, filed 30 May 2007, and U.S. Provisional Patent Application No. 61/016,691, filed 26 Dec. 2007, the entireties of which are incorporated herein by reference.

BACKGROUND

The invention relates to a digital data register with a plurality of parallel matched data paths, each data path having a data input for receiving a digital data input signal, an output driver with a data output providing a digital data output signal for application to an associated memory module, and a flip-flop arranged between the data input and the data output. A preferred application of the data register is the use in a memory system operating at clock frequencies as high as 800 MHz and above.

The purpose of such a data register, also referred to as a "registered data buffer," is to ensure the correct setup and hold timing for the related memory modules. The register should also have a phase jitter cleaning function for the clock used in the memory system. Both requirements can be met in a straightforward approach with a data register wherein a flip-flop is inserted in each data path and all flip-flops are clocked with a clean clock provided by a phase locked loop (PLL). By adjusting the delay time of a delay element in the clock input path in relation to the propagation delay time (tpd) of the data input path upstream of the flip-flop the appropriate setup and hold timing can be achieved on the pre-register side. On the post-register side, a delay element is inserted in the clock output path so as to move the clock edge to the center of the data eye of the register's data output signal. The clock output driver must be matched with the data output drivers to ensure stable timing conditions on the post-register side over variations of process, supply voltage and temperature (PVT). Likewise, the clock input path should be matched with the data input paths on the pre-register side. In this context, "matched" means similar semiconductor structures on the die so that variations of semiconductor process, supply voltage and temperature have the same effect on the propagation times of matched structures.

The pre-register timing is, however, linked with the post-register timing by the propagation delay time (tpd) from the clock input to the data output. This propagation delay should be small and constant over PVT variations. It is not possible to achieve a PVT invariant propagation delay with the architecture considered above.

SUMMARY

The invention provides a digital data register that satisfies the three requirements of: (i) setup and hold timing on the pre-register side, (ii) clock centering on the post-register side, and (iii) constant propagation delay time (tpd) over PVT variations from the clock input to the data output.

BRIEF DESCRIPTION OF THE DRAWINGS

The new architecture and the benefits of the inventive digital data register will become apparent from the following detailed description of example embodiments with reference to the appended drawings, wherein.

DETAILED DESCRIPTION OF EXAMPLE EMBODIMENTS

Figure 1:
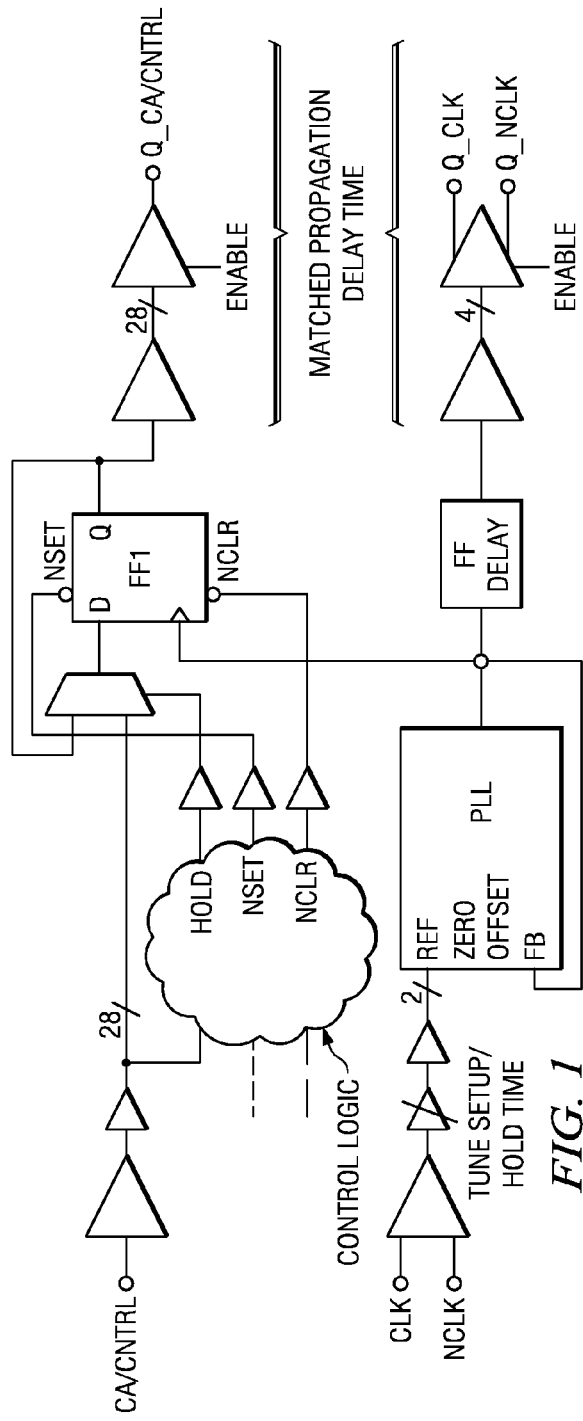
FIG. 1 is a schematic block diagram of a straightforward design for a digital data register.

The digital data register in FIG. 1 has a total of 28 parallel data paths, only one of which is shown for simplicity. Each data path extends from a data input CA/CNTRL to a data output Q_CA/CNTRL. In a DDR3 (Double Data Rate 3) memory system, there are 22 CA (Command/Address) paths and 6 CNTRL (Control) paths. Each data path includes a flip-flop FF1 and an output driver downstream of the flip-flop. The D-input of the flip-flop FF1 is connected to the output of a multiplexer, a first input of which is connected to the data input and a second input of which is connected to the Q-output of flip-flop FF1. The multiplexer is controlled by a HOLD input from control logic circuitry, which also controls the NSET and NCLR inputs of the flip-flop. The flip-flops in the data paths are all clocked by a clean clock signal supplied by a phase locked loop PLL. The PLL receives an input clock signal CLK on input REF and a feedback signal from the PLL output on its input FB. Four parallel clock output paths are provided, each with a delay flip-flop FF DELAY and an output driver, only one being shown in FIG. 1 for simplicity. The clock output drivers are matched with the data output drivers in the data paths (i.e., they have the same tpd over PVT variations).

Figure 2:
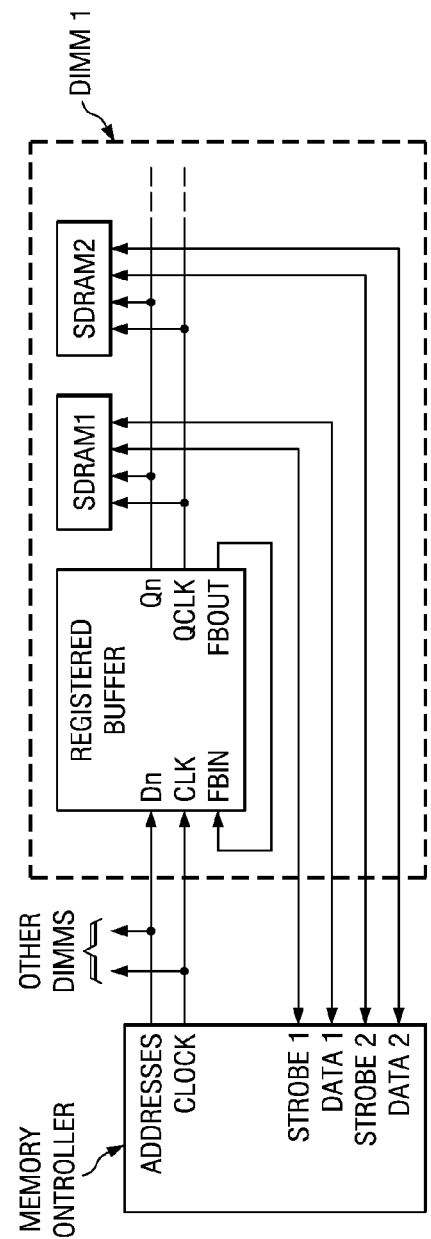
FIG. 2 is a schematic block diagram of a memory system in which the data register is typically used.

By way of an example preferred application, FIG. 2 shows a DDR3 (Double Data Rate 3) RAM (Random Access Memory) memory system with a memory controller and a DIMM module which incorporates a data register, referred to as "Registered Buffer," and a plurality of similar memory devices SDRAM1, SDRAM2, ..., with the obvious option of adding further similar DIMM modules to the memory system. Although only one data path with input signal Dn and output signal Qn is shown, it should be clear that the signals would be n bits wide.

The address/control signals and the system clock coming from the memory controller need to be routed to every SDRAM device on every DIMM board. However, as the load for these signals would be too heavy and as therefore the signal quality and timing would degrade too much, a registered buffer with PLL clock driver is placed on each DIMM module in order to buffer the incoming address/control signals and to give the address signals out with a "refreshed" waveform. The PLL clock driver has the function to "refresh" or "clean" the system clock signal. The clock signal is cleaned of its clock jitter and applied to every SDRAM on the DIMM board.

As has been discussed above, it is possible with the data register in FIG. 1 to achieve the correct setup/hold timing on the pre-register side by inserting a tuned delay element on the clock input path, and to center the clock edge in the data eye on the post-register side by introducing an appropriate delay in the clock output paths. But such configuration does not achieve a PVT invariant propagation delay time (tpd) from the clock input CLK to the data output Q_CA/CNTRL.

The architecture shown in FIG. 3 for an example digital data register embodiment in accordance with the invention has similar parallel data paths as those discussed in connection with FIG. 1, but differs in the manner in which the clock signal is generated and distributed.

Figure 3:
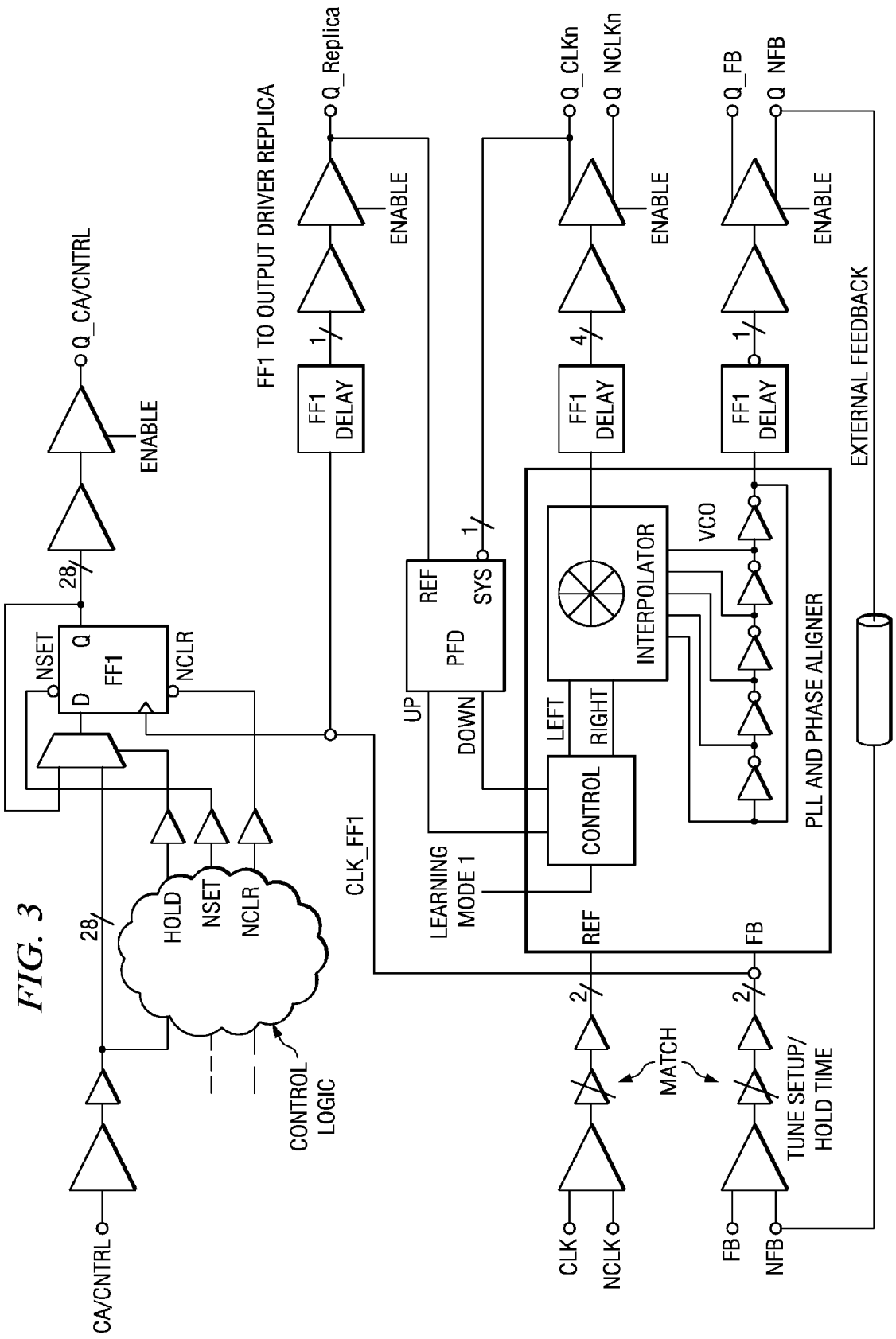
FIG. 3 is a schematic block diagram of an example of the inventive data register.

In FIG. 3, the phase locked loop PLL includes a phase aligner with a phase interpolator having inputs which are coupled with successive taps of the PLL's voltage controlled ring oscillator VCO. The output of the phase interpolator provides the output clock signal Q_CLKn, Q_NCLKn through a delay flip-flop FF1 DELAY and an output driver. The phase interpolator is controlled by "LEFT" or "RIGHT" shift control signals from a control block CONTROL. The inputs of the control block are coupled to the "UP" and "DOWN" outputs of a phase frequency detector PFD. The phase locked loop PLL receives a feedback signal on its input FB from the output of the VCO through a delay flip-flop FF1 DELAY, an output driver, an external feedback path and an input path that includes a tunable delay element. The external feedback path simulates the load "seen" by the differential clock signal outputs Q_CLKn and Q_NCLKn (the connected SDRAM modules, FIG. 2). The feedback input path is matched with the clock input path to input REF of the PLL. Although the clock signals are all differential, single paths are shown for simplicity.

The flip-flops FF1 of the data paths are all clocked by a clock signal CLK_FF1 from the feedback input FB of the PLL. A replica of a delay flip-flop FF1 DELAY and output driver receives the same clock signal CLK_FF1 and provides an output signal Q_Replica which is applied to a first input REF of the phase frequency detector PFD. A second input SYS of the PFD is coupled to the clock output Q_CLKn.

The centering of the clock within the data eye is performed once in a learn mode or continuously, as determined by a control signal "LEARNING MODE 1" applied to the control block CONTROL, by adjusting the phase of the clock output with the phase interpolator.

In this architecture, priority has been put on a constant propagation delay time tpd and on the setup/hold timing. The constant tpd is achieved due to the external feedback path and the matching of signal paths. Since the clock and feedback paths are matched, the tpd from the clock input (CLK) to the clock output (Q_CLKn) and feedback output (Q_FB) is only a function of the operating frequency. The phase difference of the clock output to the feedback output is constant over PVT variations since they are both derived from fixed phase steps of the phase aligner. The tpd from the clock input to the data output (Q_CA/CNTRL) can be changed in small steps and is only a function of the operating frequency.

The approach of the data register in FIG. 3 is based on a number of considerations. First, the overall target is to center the clock edge and to keep it centered within the data eye. Since the signal path from the clock input (CLK) to the data output (Q_CA/CNTRL) is fixed by design, the phase of the data output signal is measured, and then the clock output phase is shifted into the center of the data eye. The output driver replica is used to measure the PVT dependent delay. The output Q_Replica of the replica path is a reference phase. The PFD compares this reference phase with the phase of the output clock (Q_CLKn). Based on the "UP" or "DOWN" input from the PFD, the control block instructs the phase interpolator to shift the phase of the clock signal in the proper direction ("LEFT" or "RIGHT"). To cancel out the jitter impact on the reference signal (the output of the replica) and on the clock output signal, the control block should perform a balanced phase selection. The proper phase setting would be in the middle between an upper limit reached by successive "UP" steps and a lower limit reached by successive "DOWN" steps.

In a first mode of operation, the "LEARNING MODE 1" signal is always active. The edge of the clock signal Q_CLK is centered in the data eye of the output signal Q_CA/CNTRL irrespective of PVT variations. The control block compensates for differences in clock-tree design and die routing. This mode increases the post-register timing budget for the RAM modules. There is no tpd compensation over PVT variations.

In a second mode of operation, the learning step is carried out only once after the PLL is locked. This will compensate for process variation, but the temperature and supply voltage impact will be compensated only for the learning session. The data eye of the output signal Q_CA/CNTRL may move slightly with changes of temperature and supply voltage while the clock signal Q_CLK remains stable. The memory controller timing will gain due to the stable clock phase while the RAM modules must handle the resulting de-centering. In this mode, the critical timing has been shifted from the memory controller to the RAM modules.

Figure 4:
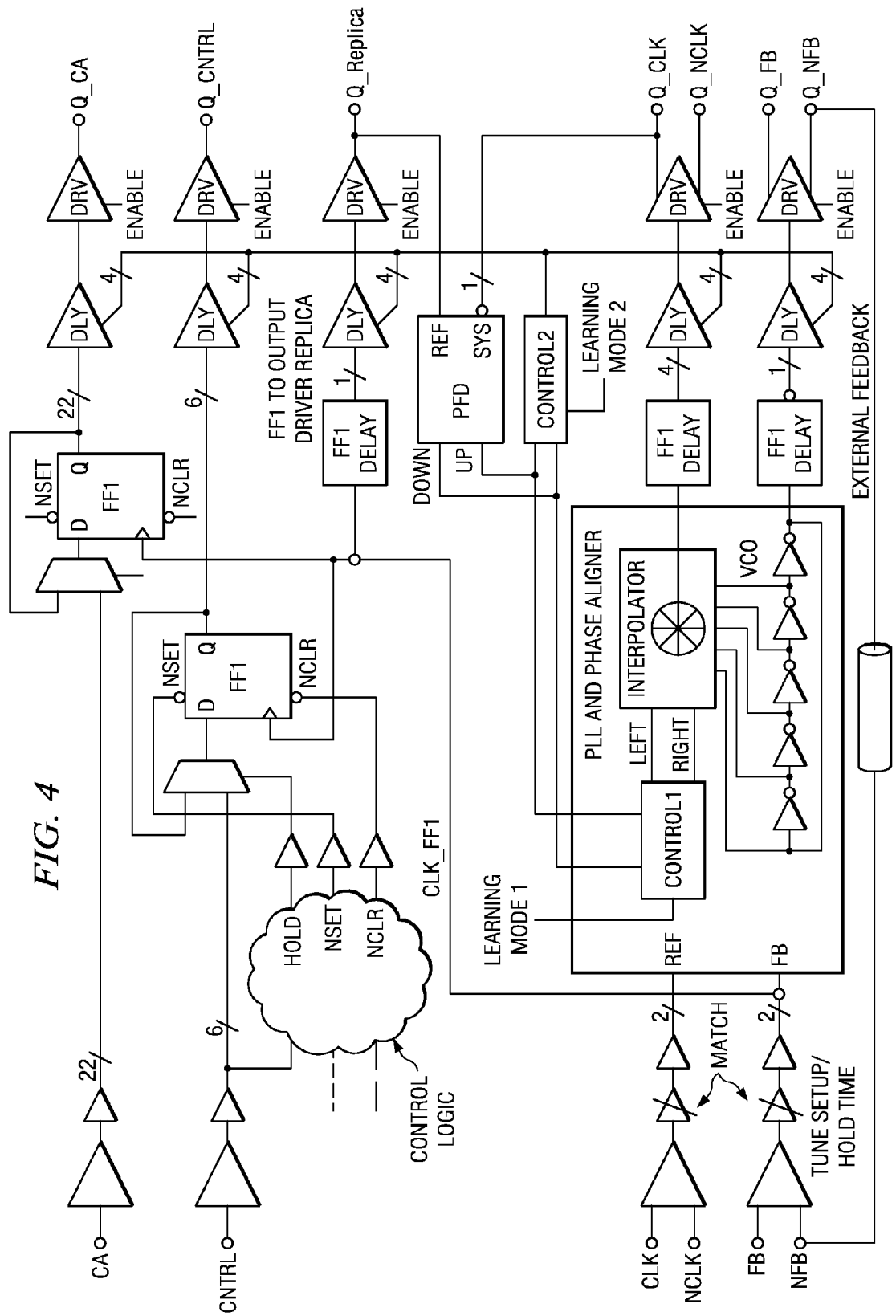
FIG. 4 is a schematic block diagram of an example of a further development of the inventive data register.

In another example embodiment shown in FIG. 4, the parallel data paths are split into two groups: (i) a first group of 22 parallel data paths from command/address signal inputs CA to command/address signal outputs Q_CA; and (ii) a second group of 6 parallel data paths from control signal inputs CNTRL to control signal outputs Q_CNTRL.

The extended functionality of this register allows different delay times for the command/address output signals Q_CA and the control output signals Q_CNTRL to account for the different driver loads. Since the flip-flops FF1 of both groups must have the same clock source (setup/hold requirement), the different delays must be introduced downstream of the flip-flops. To introduce the delays downstream of the flip-flops, a digitally controlled delay element DLY has been inserted in all output driver paths. A second control block CONTROL2 is used in addition to the control block CONTROL1 which corresponds to the control block CONTROL in FIG. 3. The second control block CONTROL2 has inputs coupled in parallel to the outputs "UP" and "DOWN" of the phase frequency detector PDF and has an output coupled to control the delay elements DLY. A second learning mode is activated by applying a signal "LEARNING MODE 2" to the second control block CONTROL2. In the second learning mode, the delays of the different delay elements are adjusted to achieve the required propagation delay time tpd for each group of data paths.

An example of a sequence control for the second learning mode is the following:
  (i) setting all delay elements DLY to the shortest delay time;
  (ii) shifting the output clock signal Q_CLK to the center of the data eye of the data output signal Q_CA of the first group of data paths by performing the required number of phase steps with the interpolator in the phase aligner;
  (iii) adding the desired offset to the output clock signal Q_CLK by performing a predetermined number of incremental phase steps with the phase aligner;
  (iv) increasing the delay time of the delay elements in the second group of data paths such that the output clock signal Q_CLK is centered with the data eye of the data output signal Q_CNTRL of the second group;
  (v) subtracting the offset added in step (iii) by performing the predetermined number of opposite incremental phase steps with the phase aligner; and
  (vi) increasing the delay time of the delay element in the output driver of the clock path to the same value as the delay time in step (iv).

Those skilled in the art to which the invention relates will appreciate that variations may be made to the described embodiments and other embodiments implemented within the scope of the claimed invention.

What is claimed is:

1. A digital data register with a plurality of parallel matched data paths, each data path having a data input for receiving a digital data input signal, an output driver with a data output providing a digital data output signal for application to an associated memory module and a flip-flop arranged between the data input and the data output, the data register further comprising:
- a clock input for receiving a clock input signal;
- a clock output for providing an output clock signal to the memory modules;
- a phase locked loop with a clock input and a feedback input;
- a feedback output providing a feedback output signal and a clock output providing a clock output signal;
- a flip-flop and output driver replica matched with the flip-flop and output driver of the data paths; and
- a phase frequency detector; wherein:
  - the flip-flops of the data paths and the flip-flop of the replica are clocked by the feedback signal applied to the feedback input of the phase locked loop;
  - the phase locked loop includes a phase aligner with a phase interpolator;
  - the phase interpolator has an output that provides the output clock signal to the memory modules through a flip-flop and output driver matched with the flip-flop and output driver of the data paths;
  - the phase frequency detector has a first input coupled to the output of the output driver replica and a second input coupled to the clock output; and
  - the phase interpolator is controlled by the output of the phase frequency detector.

2. A digital data register according to claim 1, wherein the phase locked loop has a voltage controlled ring oscillator with taps coupled to inputs of the phase interpolator and an output that supplies the feedback output signal through a flip-flop and output driver matched with the flip-flop and output driver of the data paths.

3. A digital data register according to claim 1, wherein the clock input and the feedback input of the phase locked loop are coupled through matched input drivers tuned for the setup/hold timing required by the memory modules.

4. A digital data register according to claim 3, wherein the feedback output and the feedback input of the phase locked loop are coupled through an off-chip external feedback connection that simulates an external load coupled to the clock output.

5. A digital data register according to claim 1, wherein the phase interpolator is continuously controlled by the output of the phase frequency detector after the phase locked loop has locked.

6. A digital data register according to claim 1, wherein the phase interpolator after the phase locked loop has locked is controlled by the output of the phase frequency detector in a temporary learning mode.

7. A digital data register according to claim 2, wherein the output drivers and output driver replica are each coupled in series with a digitally controllable delay element.

8. A digital data register according to claim 7, wherein the delay elements are controlled by a control unit which has control inputs connected to the outputs of the phase frequency detector.

9. A digital data register according to claim 8, wherein the data paths are split into at least two groups each associated with a different load to be driven, and the delay elements are adjusted to delay times that are different in one group from the delay time in another group.

10. A method of adjusting to a desired offset the timing of data output signals between two different groups of data paths in a digital data register as defined in claim 9, comprising the steps of:
(i) setting all delay elements to the shortest delay time;
(ii) shifting the output clock signal to the center of the data eye of the data output signal of the first group of data paths by performing the required number of phase steps with the phase aligner;
(iii) adding the desired offset to the output clock signal by performing a predetermined number of incremental phase steps with the phase aligner;
(iv) increasing the delay time of the delay elements in the second group of data paths such that the output clock signal is centered with the data eye of the data output signal of the second group;
(v) subtracting the offset added in step (iii) by performing the predetermined number of opposite incremental phase steps with the phase aligner; and
(vi) increasing the delay time of the delay element in the output driver of the clock path to the same value as the delay time in step (iv).

* * * * *